United States Patent
Sun et al.

(10) Patent No.: US 7,495,431 B2
(45) Date of Patent: Feb. 24, 2009

(54) ELECTRIC POWER CORD WITH DIGITAL MULTIMETER

(75) Inventors: Ke Sun, Shenzhen (CN); Zhen-Xing Ye, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/560,854

(22) Filed: Nov. 17, 2006

(65) Prior Publication Data

US 2008/0042640 A1 Feb. 21, 2008

(30) Foreign Application Priority Data

Aug. 7, 2006 (CN) .................. 2006 1 0200781

(51) Int. Cl.
*G01R 11/04* (2006.01)
*G01R 1/00* (2006.01)
(52) U.S. Cl. ........................... 324/157; 324/114
(58) Field of Classification Search ............... 324/114, 324/157
See application file for complete search history.

(56) References Cited

U.S. PATENT DOCUMENTS

| 4,518,819 | A |   | 5/1985 | Larsson et al. |
| 4,827,369 | A | * | 5/1989 | Saletta et al. .................. 361/96 |
| 5,900,804 | A | * | 5/1999 | Yewell ........................ 324/508 |
| 6,805,579 | B2 | * | 10/2004 | Marchand et al. ........... 439/502 |
| 7,099,785 | B2 | * | 8/2006 | Lee et al. ....................... 702/57 |
| 7,324,006 | B2 | * | 1/2008 | Godard ........................ 340/664 |
| 2004/0155661 | A1 | * | 8/2004 | Field et al. .................. 324/426 |
| 2005/0063116 | A1 | * | 3/2005 | Rotheroe ..................... 361/90 |
| 2005/0101193 | A1 | * | 5/2005 | Godard ........................ 439/652 |

* cited by examiner

*Primary Examiner*—Timothy J Dole
(74) *Attorney, Agent, or Firm*—Wei Te Chung

(57) ABSTRACT

An electric power cord includes a first plug adapted for connecting to a power source, a second plug adapted for connecting to an electric device, an electric cable, at least one sensor arranged on the electric cable, an meter chip arranged on the electric cable, and a display module arranged on the electric cable. The electric cable electrically connects the first plug and second plug. The at least one sensor collects electric characteristic analog signals of the electric cable. The meter chip receives and converts the analog signals to digital signals. The display module receives the digital signals and displays measured electrical characteristics of the electric device.

11 Claims, 2 Drawing Sheets

ELECTRIC POWER CORD WITH DIGITAL MULTIMETER

BACKGROUND OF THE INVENTION

1. Field of the Invention

The present invention relates to electric power cords, and more particularly, to an electric power cord having a multimeter which can measure and display electrical characteristics of electric devices using the power cord.

2. Description of Related Art

Generally speaking, most electric devices need electric power cords to transmit power from power sources. Measurements of electrical characteristics of the electric devices need extra measuring equipments, which is inconvenient.

What is desired, therefore, is to provide an electric power cord which can conveniently measure and display electrical characteristics of electric devices.

SUMMARY OF THE INVENTION

An electric power cord includes a first plug adapted for connecting to a power source, a second plug adapted for connecting to an electric device, an electric cable, at least one sensor arranged on the electric cable, an meter chip arranged on the electric cable, and a display module arranged on the electric cable. The electric cable electrically connects the first plug and second plug. The at least one sensor collects electric characteristic analog signals of the electric cable. The meter chip receives and converts the analog signals to digital signals. The display module receives the digital signals and displays measured electrical characteristics of the electric device.

Other advantages and novel features will become more apparent from the following detailed description when taken in conjunction with the accompanying drawings, in which:

DETAILED DESCRIPTION OF THE INVENTION

Figure 1:
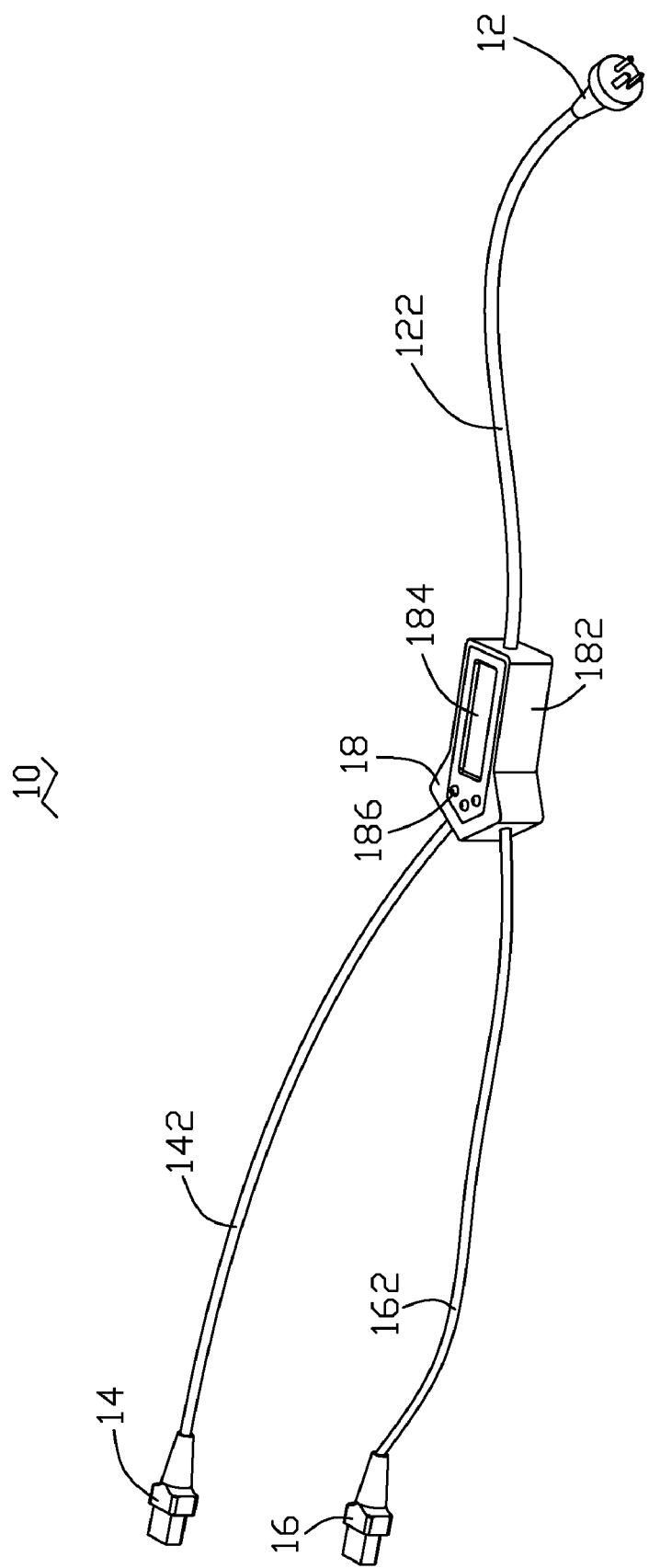
FIG. 1 is an isometric view of an electric power cable in accordance with a preferred embodiment of the present invention.

Referring to FIG. 1, an electric power cord 10 in accordance with a preferred embodiment of the present invention is shown. The electric power cord 10 includes a first plug 12, two second plugs 14 and 16, and a multimeter 18. The first plug 12 is configured for connecting to an external power source, such as a 220 V alternating current (AC) power source. The second plugs 14 and 16 are configured for connecting to electric devices, such as computers, displays, etc. An amount of the second plugs can be changed according to need.

The first plug 12 is electrically connected to an electric cable 122. The second plugs 14 and 16 are respectively electrically connected to an electric cable 142 and an electric cable 162. The electric cable 122 is electrically connected to the two electric cables 142 and 162 in the multimeter 18. The multimeter 18 includes a housing 182, a display panel 184 arranged on the housing 182, three control buttons 186 arranged on the housing 182, and a measuring circuit in the housing 182.

Figure 2:
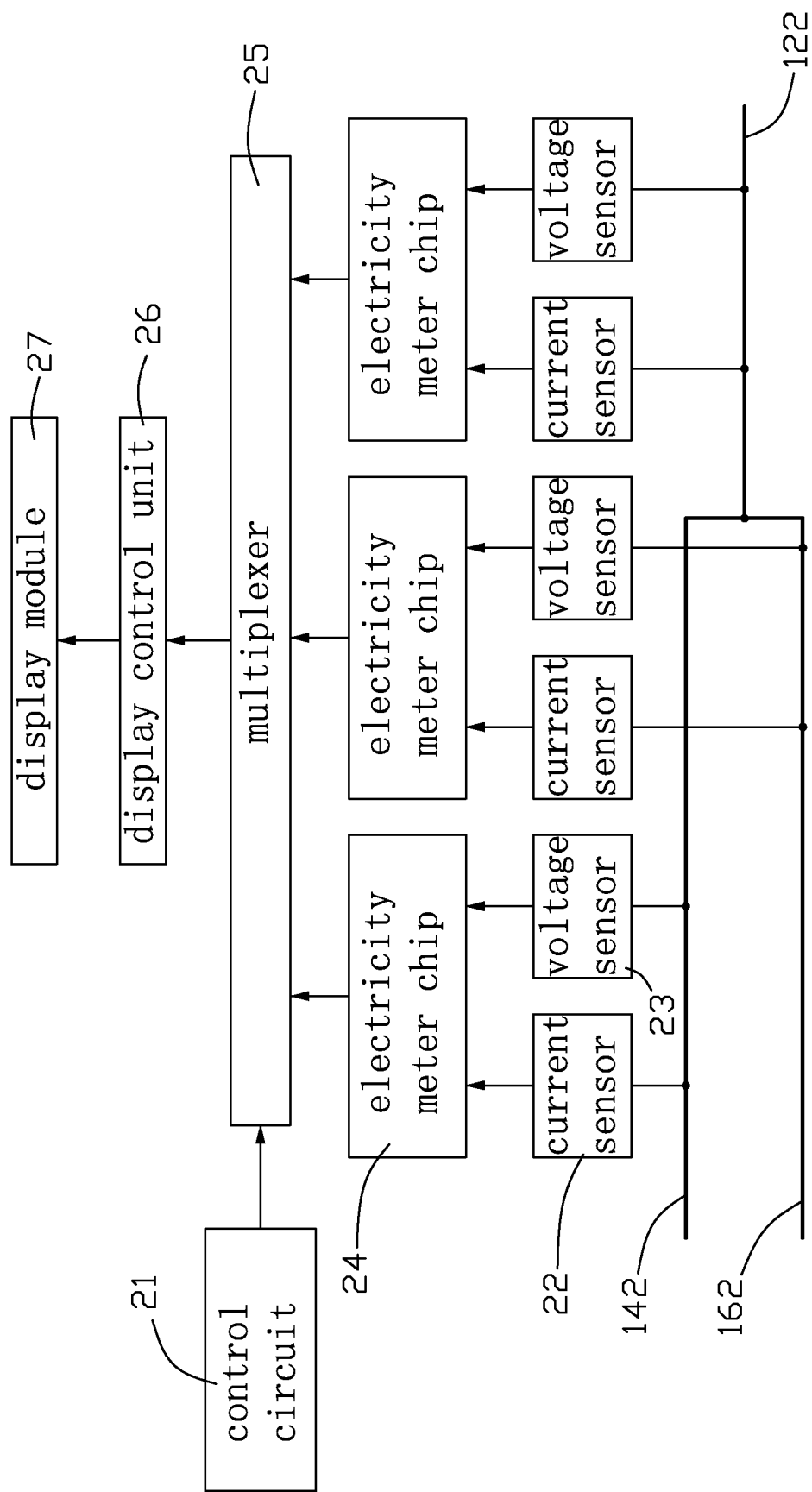
FIG. 2 is a block diagram of FIG. 1.

Referring also to FIG. 2, a block diagram of the measuring circuit of the multimeter 18 is shown. The measuring circuit of the multimeter 18 includes a control circuit 21, three meter chips 24 each with a corresponding current sensor 22 and voltage sensor 23, a multiplexer 25, a display control unit 26 such as an encoder, and a display module 27 such as a digital display. The meter chips 24 are respectively connected to the electric cables 122, 142, and 162 via their corresponding current and voltage sensors 22, 23, and can measure electrical characteristic analog signals of electric devices and convert them to digital signals correspondingly. Output terminals of the meter chips 24 are electrically connected to input terminals of the multiplexer 25. An output terminal of the multiplexer 25 is connected to the display module 27 via the display control unit 26. The control circuit 21 is connected to the multiplexer 25, and the three control buttons 186 are arranged in the control circuit 21 for controlling the multiplexer 25 to select one of the meter chips 24 corresponding to one of the electric cables 122, 142, 162 for which it is desired to know the electrical characteristics thereof. The display module 27 is attached on the display panel 184 to display electric characteristics of the selected electric cable for users.

When the first plug 12 is electrically coupled to an external power source, and the second plugs 14 and 16 are connected to electric devices, the electric devices are supplied with power from the external power source by the electric power cord 10. At this time, each current sensor 22 and each voltage sensor 23 collect current and voltage analog signals of the corresponding electric cable 122, 142, or 162, and output the current and voltage analog signals of the corresponding electric cables 122, 142, or 162 to the corresponding meter chip 24. The corresponding meter chip 24 then converts the analog signals to digital signals. The control circuit 21 controls the multiplexer 25 to receive the digital signals according to a selection made by a user via the three control buttons 186. The display control unit 26 receives the digital signals from the multiplexer 25 and drives the display module 27 to display information corresponding to the digital signals on the display panel 184 in real time.

If there is only one second plug 14 or 16, the multiplexer can be deleted, and only one current sensor 22, one voltage sensor 23, and one meter chip 24 are needed. In addition, if the one meter chip 24 can drive the display module 27, the display control unit 26 can also be deleted. The electric power cord 10 can display electrical characteristics of electric devices in real time, which is very convenient for users.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments.

What is claimed is:

1. An electric power cord comprising:
   a first plug having a first electric cable adapted for connecting to a power source;
   two second plugs adapted for connecting two electric devices, each electrically connected to the first electric cable of the first plug via a second electric cable;
   a first sensor electrically connected to the first electric cable for collecting electric characteristic analog signals thereof;
   two second sensors respectively electrically connected to the two second electric cables for collecting electric characteristic analog signals thereof;
   three meter chips respectively electrically connected to the first and second sensors for receiving and converting the analog signals to digital signals;

a multiplexer electrically connected to the meter chips;

a control circuit controlling the multiplexer to selectively receive the digital signals of one of the meter chips;

a display control unit electrically connected to the multiplexer; and a display module, the display control unit receiving the digital signals from the multiplexer and driving the display module to display electrical characteristics of the electric device corresponding to the digital signals, wherein the three sensors, the three meter chips, the multiplexer, the control circuit, the display control unit, and the display module are secured with respect to the electric cables.

2. The electric power cord as claimed in claim 1, wherein each of the three sensors includes a current sensor and a voltage sensor.

3. The electric power cord as claimed in claim 1, wherein the control circuit includes a plurality of buttons for controlling the multiplexer.

4. The electric power cord as claimed in claim 1, wherein the display control unit is an encoder.

5. The electric power cord as claimed in claim 1, wherein the display module includes a digital display.

6. The electric power cord as claimed in claim 1, further comprising a housing secured to the electric cable, the three sensors, the multiplexer, the three meter chips, the control circuit, the display control unit, and the display module arranged in the housing.

7. The electric power cord as claimed in claim 6, wherein a display panel arranged on a surface of the housing for securing the display module.

8. An electric power cord comprising:

a first plug configured to connect to a power source;

a second plug configured to connect to an electronic device;

an electric cable electrically connecting the first plug and the second plug;

a housing secured to the electric cable, the housing containing therein a current sensor electrically connected to the electric cable for collecting analog signals thereof;

a voltage sensor electrically connected to the electric cable for collecting voltage analog signals thereof; and a meter chip electrically connected to the current and voltage sensors for receiving and converting the current and voltage analog signals to digital signals;

a display module to display the digital signals;

a plurality of additional second plugs configured to connect with a plurality of additional electronic devices, the additional second plugs electrically connected to the electric cable via additional electric cables;

a plurality of sensors electrically connected to the additional electric cables respectively for collecting electrical characteristic analog signals thereof, and a plurality of meter chips electrically connected to the sensors respectively for converting the analog signals to the digital signals; and a multiplexer contained in the housing and electrically connected between the meter chips and the display module for selecting the digital signals of one of the meter chips to be displayed by the display module.

9. The electric power cord as claimed in claim 8, wherein a control circuit is electrically connected to the multiplex for controlling the multiplex to select the digital signals from one of the meter chips.

10. The electric power cord as claimed in claim 9, wherein a plurality of buttons is arranged at an external surface of the housing and electrically connected to the control circuit.

11. The electric power cord as claimed in claim 8, wherein the display module comprises a display panel arranged at an external surface of the housing.

\* \* \* \* \*